(12) United States Patent
Shirakawa et al.

(10) Patent No.: US 6,744,020 B2
(45) Date of Patent: Jun. 1, 2004

(54) HEAT PROCESSING APPARATUS

(75) Inventors: Eiichi Shirakawa, Kikuchi-gun (JP); Tetsuo Fukuoka, Kikuchi-gun (JP); Tsuyoshi Nogami, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 171 days.

(21) Appl. No.: 10/028,789

(22) Filed: Dec. 28, 2001

(65) Prior Publication Data

US 2002/0086259 A1 Jul. 4, 2002

(30) Foreign Application Priority Data

Jan. 4, 2001 (JP) .................................... 2001-000243
Jan. 4, 2001 (JP) .................................... 2001-000244

(51) Int. Cl.$^7$ ............................................. H05B 1/02
(52) U.S. Cl. .................................. 219/494; 219/444.1
(58) Field of Search ........................... 219/444.1, 494, 219/390, 385, 391, 393, 395, 398, 399, 400, 401, 405, 413, 482, 483; 438/765, 795; 118/50, 715, 724, 725, 50.1, 730; 257/E21.586; 29/85.01; 432/241; 430/330; 216/41

(56) References Cited

U.S. PATENT DOCUMENTS 5,194,401 A * 3/1993 Adams et al. ............... 438/765
5,244,501 A * 9/1993 Nakayama et al. .......... 118/725
5,431,700 A * 7/1995 Sloan ........................ 29/25.01
5,620,560 A * 4/1997 Akimoto et al. ............... 216/41
6,246,030 B1   6/2001 Matsuyama

FOREIGN PATENT DOCUMENTS

JP          10-189429         7/1998
JP          2000-183069       6/2000

* cited by examiner

*Primary Examiner*—Tu Ba Hoang
(74) *Attorney, Agent, or Firm*—Oblon, Spivak, McClelland, Maier & Neustadt, P.C.

(57) ABSTRACT

A heat processing apparatus comprises a hot plate for putting the substrate on or near its surface, a ceiling with a first and second concentric regions with a first and second heat pipes, respectively, opposite to the hot plate surface, a member surrounding a space between the hot plate and the ceiling, a gas flow generator supplying gas to the a region from a circumference of the hot plate to a center of the ceiling, and a temperature control mechanism for controlling a regional temperature of the first region in such a manner that a heat emission is greater from a center of the substrate than from a circumference of the substrate, thus heating a substrate to a uniform temperature all over its surface.

33 Claims, 16 Drawing Sheets

HEAT PROCESSING APPARATUS

BACKGROUND OF THE INVENTION

1. Field of the Invention

The present invention relates to a heat processing apparatus for heating a substrate such as a semiconductor wafer, when, for example, a photoresist is coated and developed.

2. Description of the Related Art

In the photolithography process for manufacturing a semiconductor device, a photoresist film is coated on a wafer, light-exposed in accordance with a prescribed circuit pattern, and developed.

Here, the photolithography process includes various heat processing such as pre-baking after the resist coating, post exposure baking after the light-exposure, and post-baking after the development.

These heat processing are executed in a heat processing apparatus, wherein the wafer is placed on or near the surface of a hot plate.

One of the conventional heat processing apparatus includes: a cover for covering a circumference of the hot plate; and a ceiling over the wafer, thereby forming a heat process space between the hot plate and the ceiling. The wafer is heated in an air which is introduced from outside of the heat processing apparatus, flows from the circumference of the hot plate to the center and is exhausted from the center of the ceiling. It is desired that the hot plate is heated uniformly in order to heat the wafer uniformly in this heat processing apparatus.

However, as the air flows from the circumference of the wafer to the center of the wafer, the heated air passing over the high temperature wafer is concentrated at the center of the wafer.

Therefore, the temperature of the wafer center is higher than that of the wafer circumference, even when the hot plate is uniformly heated.

BRIEF SUMMARY OF THE INVENTION

An object of the present invention is to provide a heat processing apparatus which improves a uniformity in temperature on a surface substrate such as a wafer substrate.

The heat processing apparatus of the $1^{st}$ invention comprises: a hot plate for putting the substrate on or near its surface; a ceiling with a first and second regions opposite to the hot plate surface; and a temperature control mechanism for controlling a regional temperature of at least one of the first and second regions, wherein the temperature control mechanism controls the regional temperature, in accordance with a temperature distribution of the substrate heated by the hot plate.

The heat processing apparatus of the $2^{nd}$ invention comprises: a hot plate for putting the substrate on or near its surface; a ceiling with a first and second concentric regions opposite to the hot plate surface; a surrounding member for surrounding a space between the hot plate and the ceiling; gas flow generation means for generating a gas flow in the space from a circumference of the hot plate to a center of the ceiling, and a temperature control mechanism for controlling a regional temperature of the first region, wherein the temperature control mechanism controls the regional temperature in such a manner that a heat emission is greater from a center of the substrate than from a circumference of the substrate.

The heat processing apparatus of the $3^{rd}$ comprises: a hot plate for putting the substrate on or near its surface; a ceiling with a first and second concentric regions opposite to the hot plate surface; a temperature control mechanism for controlling a regional temperature of the first region; and a heating mechanism for heating the second region, wherein the first region is opposite to a part of the substrate of which temperature is higher, while the second region is opposite to the rest of the substrate of which temperature is lower; the temperature control mechanism controls the regional temperature in such a manner that the regional temperature is lower in the first region than in the second region, and the heating mechanism heats the second region up to a prescribed temperature in accordance with a temperature at a part of the substrate opposite to the second region.

The heat processing apparatus of the $4^{th}$ comprises: a hot plate for putting the substrate on or near its surface; a ceiling with a first and second concentric regions opposite to the hot plate surface; a surrounding member for surrounding a space between the hot plate and the ceiling; gas flow generation means for generating a gas flow in the space from a circumference of the hot plate to a center of the ceiling; a temperature control mechanism for controlling a regional temperature of the first region, and a heating mechanism for heating the second region, wherein: the temperature control mechanism controls the regional temperature in such a manner that the regional temperature is lower in the first region than in the second region; and the heating mechanism heats the second region in accordance with a temperature of a part of the substrate opposite to the second region.

According to the $1^{st}$ invention, the temperature becomes uniform all over the substrate, by promoting a heat emission from a hotter portion of the substrate, because the first region opposite to the hotter portion of the substrate is made cooler than the second region, thereby increasing a heat absorption by the first region. Further, the temperature uniformity on the substrate surface is improved by controlling the cooling of the first region by the temperature control mechanism.

Further, according to the $2^{nd}$ invention, the temperature uniformity on the substrate surface is improved, particularly when the substrate is heated in a gas flow from the circumference to the center of the hot plate, because there are provided first and second concentric regions on the ceiling, wherein the temperature of first region is controlled as in the $1^{st}$ invention.

Further, according to the $3^{rd}$ invention, the temperature becomes quite uniform all over the substrate, by promoting a heat emission from a hotter portion of the substrate, because the first region opposite to the hotter portion of the substrate is made cooler than the second region, thereby increasing a heat absorption by the first region, and at the same time the second region is heated by the heating mechanism, thereby suppressing a heat radiation from the cooler portion of the substrate.

Further, according to the $4^{th}$ invention, the temperature uniformity on the substrate surface is improved, particularly when the substrate is heated in a gas flow from the circumference to the center of the hot plate, because there are provided first and second concentric regions on the ceiling, wherein the temperature of first and second regions are controlled as in the $3^{rd}$ invention.

Further, in the $1^{st}$ to $4^{th}$ inventions, a heat pipe may be employed, in order to make the temperatures of each region uniform and rapidly stabilize it due to a rapid transportation of a great deal of heat by the heat pipe.

Further, in the $1^{st}$ to $4^{th}$ inventions, it is preferable that the heat absorption of the first region is higher than that of the second region in order to promote the heat emission from the hotter portion of the substrate, thereby improving the temperature uniformity more rapidly. Therefore, The first region may preferably a black body, while the second region may preferably a mirror.

DETAILED DESCRIPTION OF THE INVENTION (First embodiment)

Figure 1:
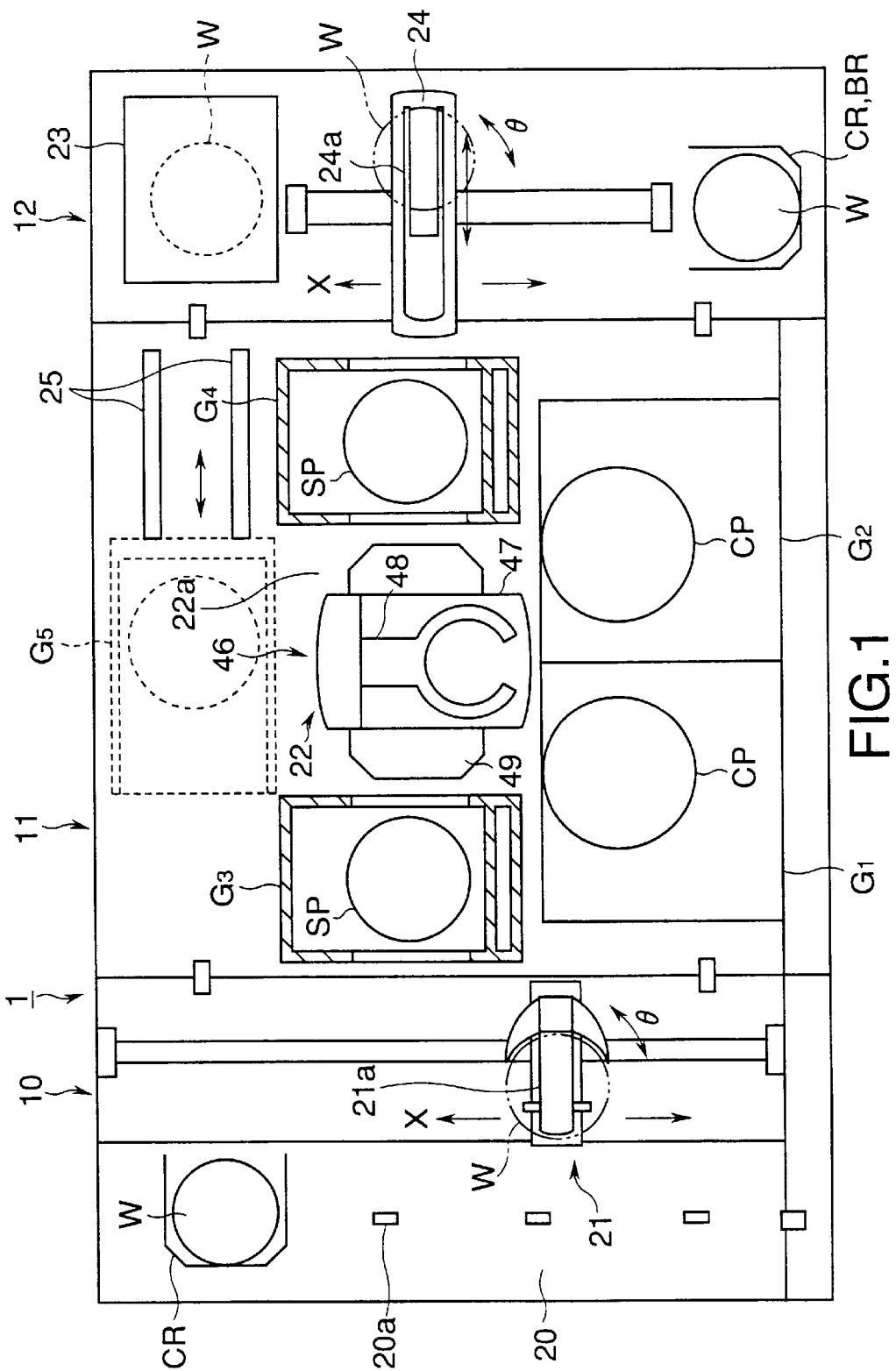
FIG. 1 is a plan view of a photoresist coating and development system including a heat processing apparatus of the present invention.

As shown in FIG. 1, the photoresist coating and development system I includes a heat processing apparatus of the present invention comprises: a cassette station 10 for transporting the substrate such as semiconductor wafers W; a process station 11 including a plurality of process units; an interface section 12 for transporting the semiconductor wafers W to and from a not-shown semiconductor stepper adjacent to the interface section 12. The cassette station 10 transports between a coating and development system and another system a wafer cassette CR for containing a plurality of, for example, twenty five wafers, or delivers the wafers W between the wafer cassette CR and the process station 11.

A plurality of, for example, 4 positioning projections 20a along X direction on a table 20 for placing the cassettes CR is formed in the cassette station 10, thereby arranging the cassettes CR at the positioning projections in a line with their entrances (exits at the same time) for the wafers turned to the process station 11. The wafers W are arranged in vertical direction or Z direction in the cassette CR. Further, cassette station 10 includes wafer transport mechanism 21 between the table 20 and the process station 11. The wafer transport mechanism 21 includes a wafer transport arm 21a movable in the cassette arrangement direction (X direction) and the wafer arrangement direction (Z direction), thereby selectively accessing one of the cassettes CR. Further, the wafer transport arm 21a is made rotative in θ direction, thereby accessing an alignment unit ALIM and an extension unit EXT in a process unit group $G_3$ in the process station 11.

The process station 11 includes a plurality of process units for a series of processes for coating and developing the photoresist film. These process units are arranged at prescribed positions and in multi stairs, thereby executes the heat processing to the wafer W one by one.

Further, the process station 11 includes in its central portion a transport route 22a wherein a main wafer transport mechanism 22. All of the process units are arranged around the transport route 22a. These process units are divided into a plurality of process unit groups each of which is arranged in vertical direction in multi stairs.

In this embodiment, the first group GI and the second group $G_2$ are arranged at the front portion of the system 1, while the third group $G_3$ is arranged adjacent to the cassette station 10 at the rear portion of the system 1 and the fourth group $G_4$ is arranged adjacent to the interface section 12 at the rear portion of the system 1. Further, the fifth group $G_5$ can be arranged at the rear portion of the system 1.

Figure 2:
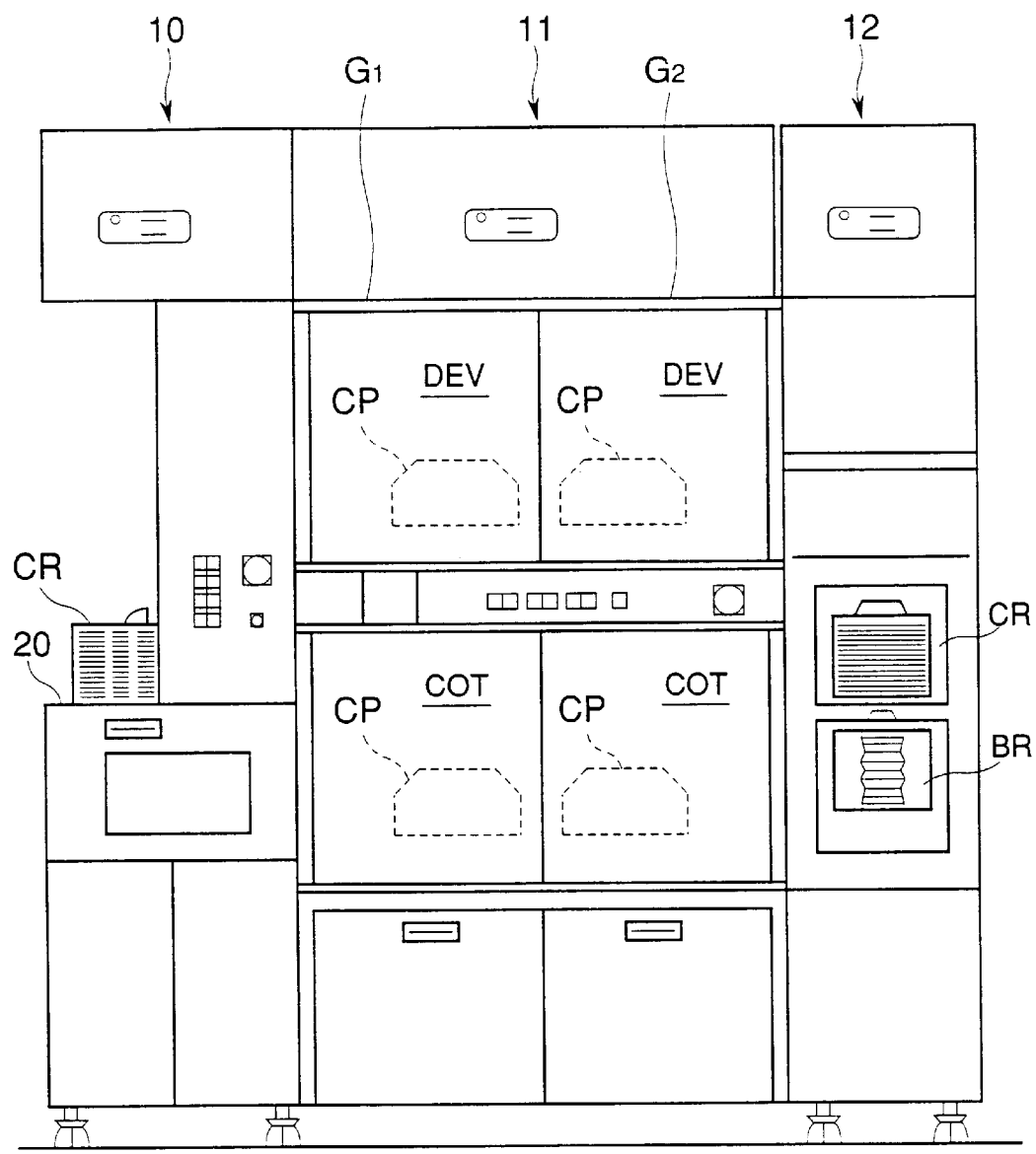
FIG. 2 is a front view of the photoresist coating and development system as shown in FIG. 1.

As shown in FIG. 2, in the first process group $G_1$, a resist coating unit COT for coating a resist on the wafer W placed on a not-shown spin chuck in a cup CP is installed at a lower stair, while a development unit DEV for developing a resist pattern in a cup CP is installed at an upper stair. Similarly, in the second process group $G_2$, a resist coating unit COT for coating a resist on the wafer W placed on a not-shown spin chuck in a cup CP is installed at a lower stair, while a development unit DEV for developing a resist pattern in a cup CP is installed at an upper stair.

Figure 3:
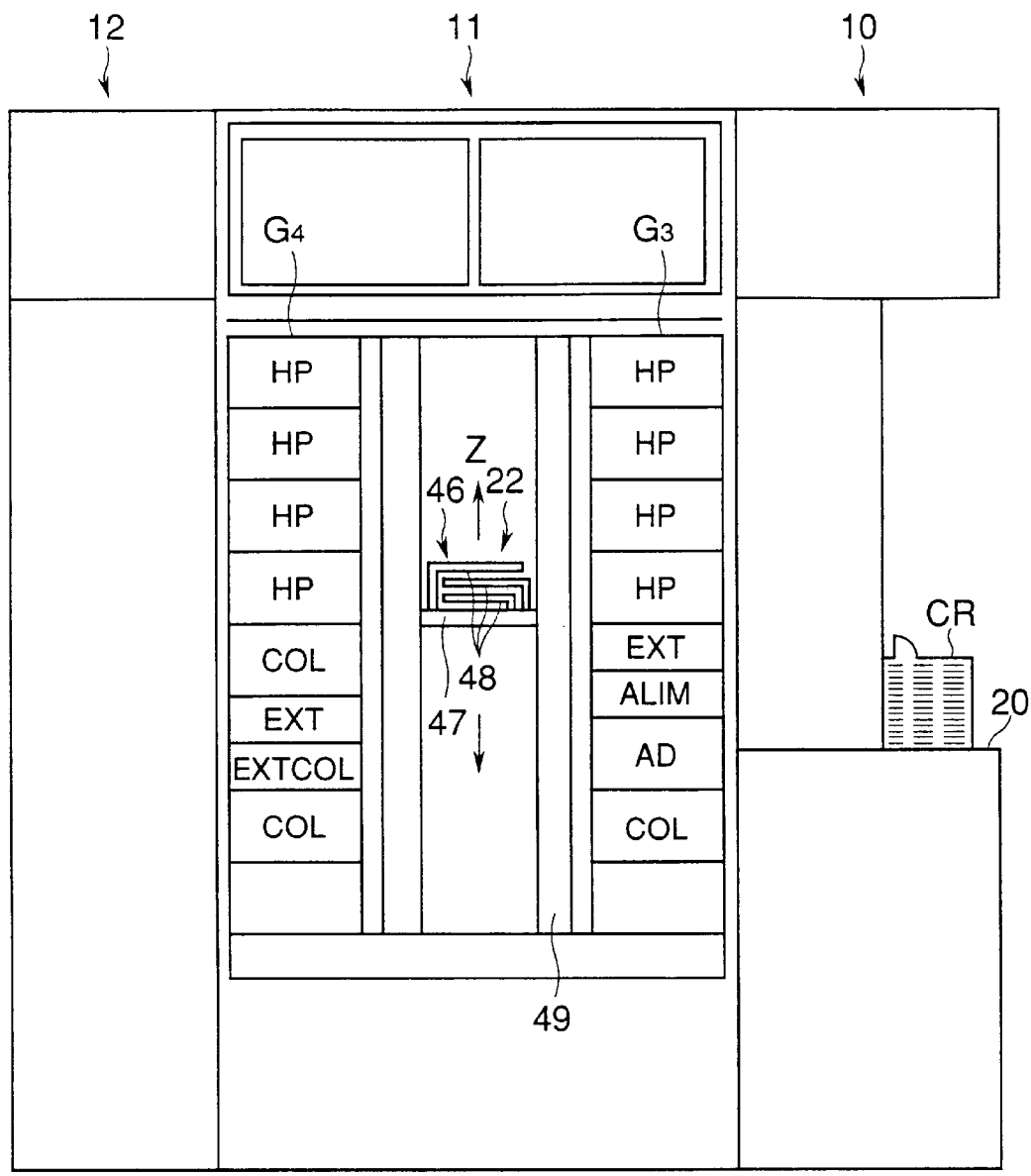
FIG. 3 is a rear view of the photoresist coating and development system as shown in FIG. 1.

As shown in FIG. 3, in the third process group $G_3$, a plurality of oven type process units for executing prescribed process to the wafer W on tables SP is arranged in multi stairs. Concretely, there are arranged from the lowest stair to the highest stair eight process units such as a cooling unit COL for a cooling processing, an adhesion unit AD for a hydrophobic processing for improving an adhesion of the resist to the wafer W, an alignment unit ALIM for positioning the wafer, an extension unit EXT for transporting the wafer W, and four heat processing apparatuses HP for various heat processing at pre-light-exposure, post-light-exposure, and post-development. Further, the alignment unit ALIM may be replaced by the cooling unit COL which works also as an alignment unit.

In the fourth process group $G_4$, a plurality of oven type process units are arranged similarly in multi stairs. Concretely, there are arranged from the lowest stair to the highest stair eight process units such as a cooling unit COL, an extension cooling unit EXTCOL which is an entrance/exit for the wafer W provided with a cooling plate, an extension unit EXT, a cooling unit COL, and four heat processing apparatuses HP.

When the fifth process unit group $G_5$ is installed at the rear portion of the main wafer transport mechanism 22, the group $G_5$ is made movable sideways along a guide rail 25, thereby ensuring a space for executing a maintenance for the main wafer transport mechanism 22.

The depth in X direction of the interface section 12 the same as that of the process station 11, as shown in FIG. 1.

As shown in FIG. 2, there are arranged a movable pickup cassette CR at the lower portion and a fixed buffer cassette BR at the front potion of the interface section 12. As shown in FIG. 1, while there are arranged a peripheral exposure apparatus 23 at the rear portion of the interface section 12 and a wafer transport mechanism 24 in the central portion of the interface section 12. The wafer transport mechanism 24 includes a wafer transport arm 24a movable in X and Z directions, thereby accessing the movable cassette CR, fixed cassette BR, and the peripheral exposure apparatus 23. Further, the wafer transport arm 24a is made rotative in θ direction, thereby accessing an extension unit EXT in a process unit group $G_4$ and a not-shown wafer transport table adjacent to the peripheral exposure apparatus 23.

Next, the operation of the resist coating and development system is explained. First, the wafer transport arm 21a of the wafer transport mechanism 21 in the cassette station 10 accesses the wafer cassette CR for containing wafers to be treated, thereby picking up a wafer and transporting it to the extension unit EXT in the process unit group $G_3$.

The wafer W is transported from the extension unit EXT and received by the wafer transport apparatus 46 of the main wafer transport mechanism 22, aligned by the alignment unit ALIM in the process unit group $G_3$, and transported to the adhesion unit AD for the hydrophobic processing (HMDS processing) in order to improve the adhesion of the resist to the wafer. As the HMDS processing is accompanied by heating, the wafer W is cooled in the cooling unit COL.

When the wafer is cooled down to a prescribed temperature at the cooling unit COL, the wafer is transported by the wafer transport apparatus 46 to the resist coating unit COT, thereby forming a coated film. After the coating, the wafer is pre-baked in one of the heat processing apparatuses HP in the process unit group $G_3$ or $G_4$, and then again cooled in one of the cooling units COL.

The cooled wafer is transported to the alignment unit ALIM for the alignment in the third process unit group $G_3$ and then transported through the extension unit in the fourth process unit group $G_4$ to the interface section 12.

Then, the peripheral exposure apparatus 23 in the interface section 12 exposes the peripheral portion of, for example, 1 mm width from the circumference of the wafer W in order to remove unnecessary portion of the resist. Next, a not-shown stepper adjacent to the interface section 12 exposes the resist film in accordance with a prescribed pattern.

The exposed wafer is returned back by the wafer transport mechanism 24 to the interface section 12, and transported to the extension unit EXT in the process unit group $G_4$. Further, the wafer W is transported by the wafer transport apparatus 46 to one of the heat processing apparatuses HP to apply the post-exposure processing, and then cooled down to a prescribed temperature.

Then, the wafer W is transported to the developing unit DEV for developing the pattern. After the developing, the wafer W is transported to one of the heat processing apparatuses HP to apply the post-bake processing, and then cooled down to a prescribed temperature.

After completing a series of these processing, the wafer W is returned back through the extension unit EXT in the third process unit $G_3$ to one of the cassettes in the cassette station 10.

As shown in FIG. 3, the main wafer transport mechanism in a cylindrical body 49 includes the wafer transport apparatus 46 movable in up and down direction or Z direction. The wafer transport apparatus 46 as well as the cylindrical body 49 is rotated by a not-shown motor. The wafer transport apparatus 46 is provided with a plurality of holding member 48 movable in the front and rear directions of a transport table 47, thereby transporting to and from each process unit.

Next, the heat processing apparatus HP of the first embodiment of the present invention is explained.

Figure 4:
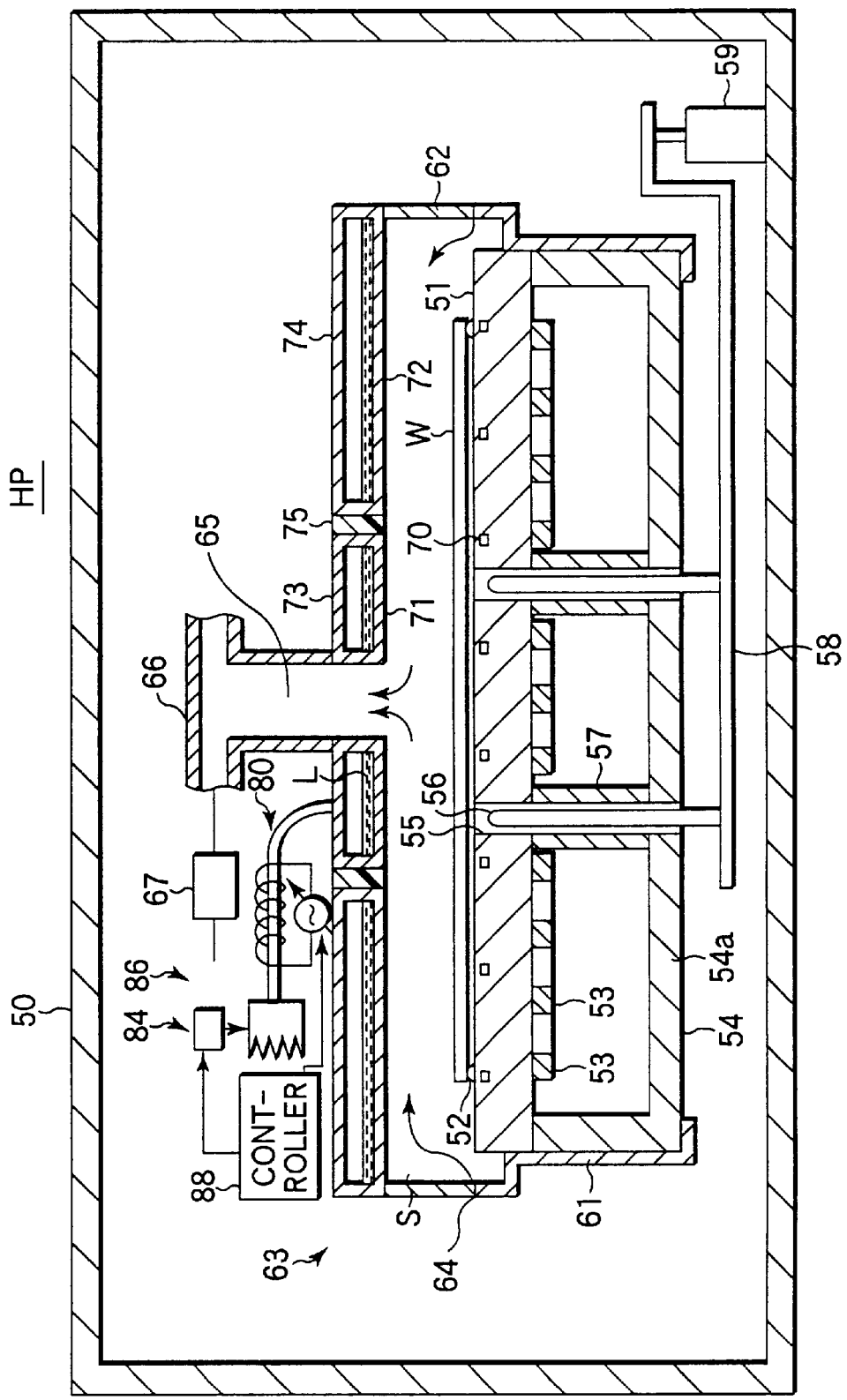
FIG. 4 is a cross sectional view of a heat processing apparatus of the first embodiment of the present invention.

As shown in FIG. 4, the heat processing apparatus HP of the present embodiment includes a disk-like hot plate 51 in a casing 50. The hot plate 51 is made of aluminum and the surface thereof is provided with proximity pins 52 on which the wafer is placed in the proximity of the hot plate surface. There are arranged under the back surface of the hot plate 51 a plurality of ring heaters 53 in a concentric manner. The heaters 53 is heated by electric currents, thereby heating the hot plate 51 and the wafer W. In this case, the electric current in each heater 53 may preferably be controlled independently.

The hot plate 51 is supported by a hollow support member 54. There are in the inner portion of the hot plate 51 formed a plurality of, for example, three through holes 55 (two of which is shown) through each of which a pin 56 is provided for ascending and descending the wafer W. Further, cylindrical guide members 57 leading to the through holes 55 are provided between the hot plate 51 and a base plate 54a of the hollow support member 54, thereby moving the pins 56 without being disturbed by heater wirings. These pins 56 are supported by support plate 58 which is moved upward and downward by a cylinder mechanism 59 beside the hollow support member 54.

There is provided around the hot plate 51 and the hollow support member 54 a support ring 61 on which there is provided a surrounding member 62 on which there is further provided a ceiling 63, thereby forming a process space S for processing of the Wafer W, surrounded by the surrounding member 62, between the ceiling 63 and the hot plate 51. An air is allowed to flow into the process space S through a minute gap 64 between the support ring 61 and the surrounding member 62. Further, when the wafer W is transported to and from the hot plate 51, the surrounding member 62 and the ceiling 63 are moved upward by a not-shown cylinder mechanism.

An exhaust pipe 66 is connected with a exhaust port 65 at the center of ceiling 63, thereby exhausting the air in the process space S which is introduced from the minute gap 64. Therefore, in the process space S, the air flows from the circumference of the hot plate 51 to the center of the ceiling 63. The air flow is controlled by a electromagnetic valve 67.

Figure 5:
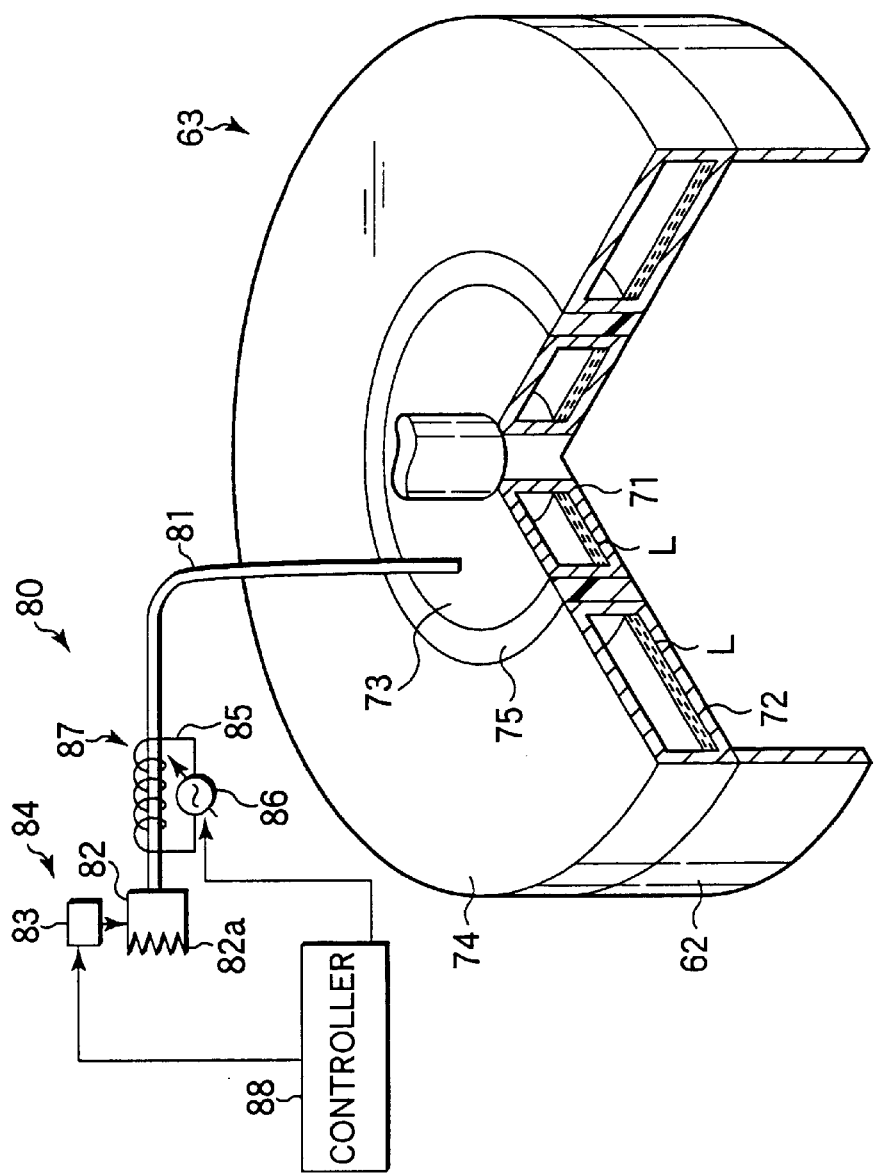
FIG. 5 is a partially cutaway view in perspective of a ceiling in the heat processing apparatus as shown in FIG. 4.

As shown in FIG. 5, there are provided on the surface of the ceiling 63 opposite to the hot plate 51 a first annular region 71 including a first heat pipe 73 surrounding the exhaust port 65 and a second annular region 72 including a second heat pipe 74 outside the first region 71. Further, there is provided between the first heat pipe 73 and the second heat pipe 74 an adiabatic member 75 which reduces a thermal interference between the first heat pipe 73 and the second heat pipe 74. The first heat pipe 73 may be separated from the second heat pipe 74 without putting the adiabatic member 75.

Figure 6:
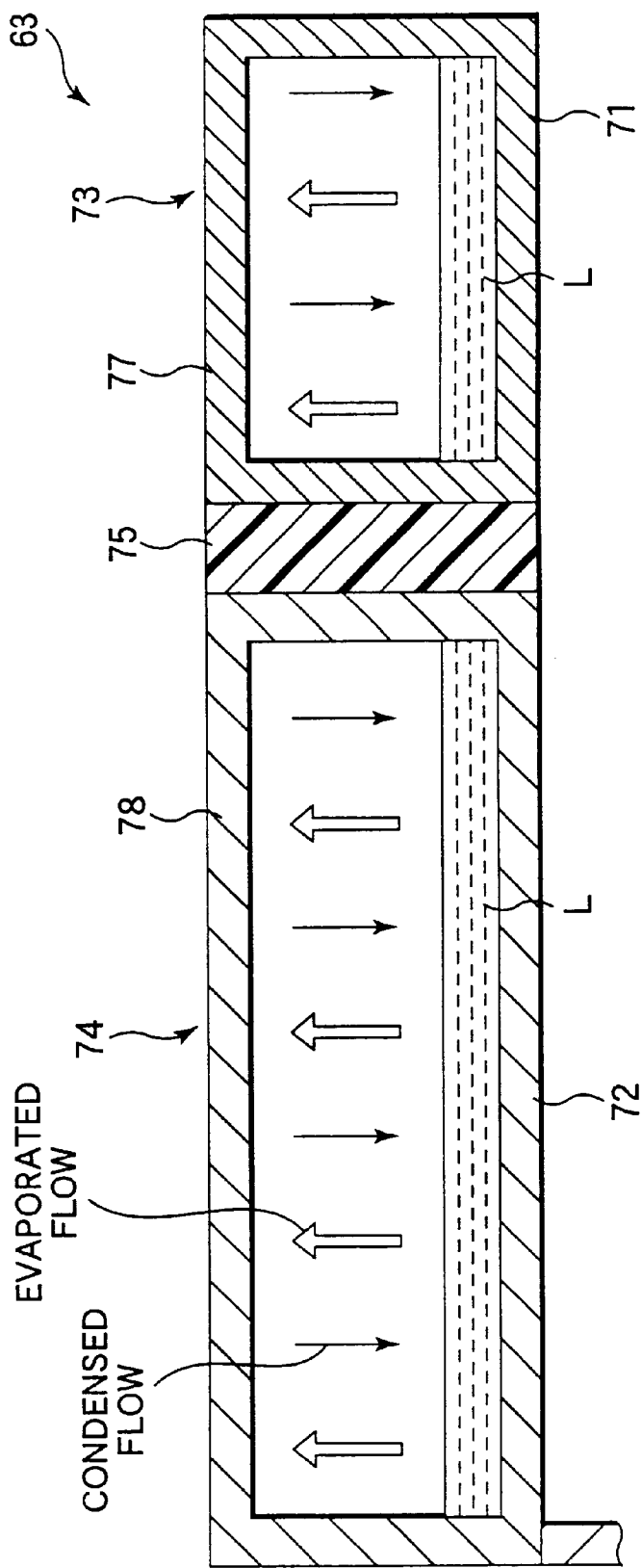
FIG. 6 is a cross sectional view of a first and second heat pipes on the ceiling as shown in FIG. 5.

As shown in FIG. 6, the first and second heat pipes 73 and 74 include containers 77 and 78, respectively, of copper or copper alloy wherein a working liquid L is sealed, thereby transporting a large quantity of heat by utilizing a evaporation and condensation of the working liquid L and making the temperature inside heat pipe uniform rapidly.

Concretely, When the lower part of the heat pipe is heated by the hot plate 51, vapor of the working liquid L moves toward the upper cool part rapidly, thereby making the temperature uniform in the vertical direction. The working liquid L condensed on the upper wall of the heat pipe drops down again due to the gravity. Similarly, the temperature is made uniform in the circumferential and radial direction, by the vapor movement. The cross sectional height of the inner space of the heat pipes 73 and 74 is constant along the circumferential direction. Further, the working liquid L is selected among the liquids which do nor affect the container material such as water, ammonia, methanol, acetone, or chlorofluorocarbons.

Further, a temperature control mechanism 80 is attaché to the first heat pipe 73. The temperature control mechanism 80 comprises: a metallic thermal conduction member 81 such as a bar for conducting heat to the first region; a radiator mechanism 84 including a radiator member 82 with a variable radiator fin 82a and an actuator 83 for changing a radiation area of the variable fin 82a; a heating mechanism 87 including an induction coil 85 wound around a part of the heat conduction member 81 and a high frequency power supply 86 for supplying a high frequency current for the induction coil 85; and a controller 88 for controlling the actuator 83 and the high frequency power supply 86. The temperature control mechanism 80 works in such a manner that the temperature of the first region 71 is lower by a prescribed degree than that of the second region 72.

Figure 7:
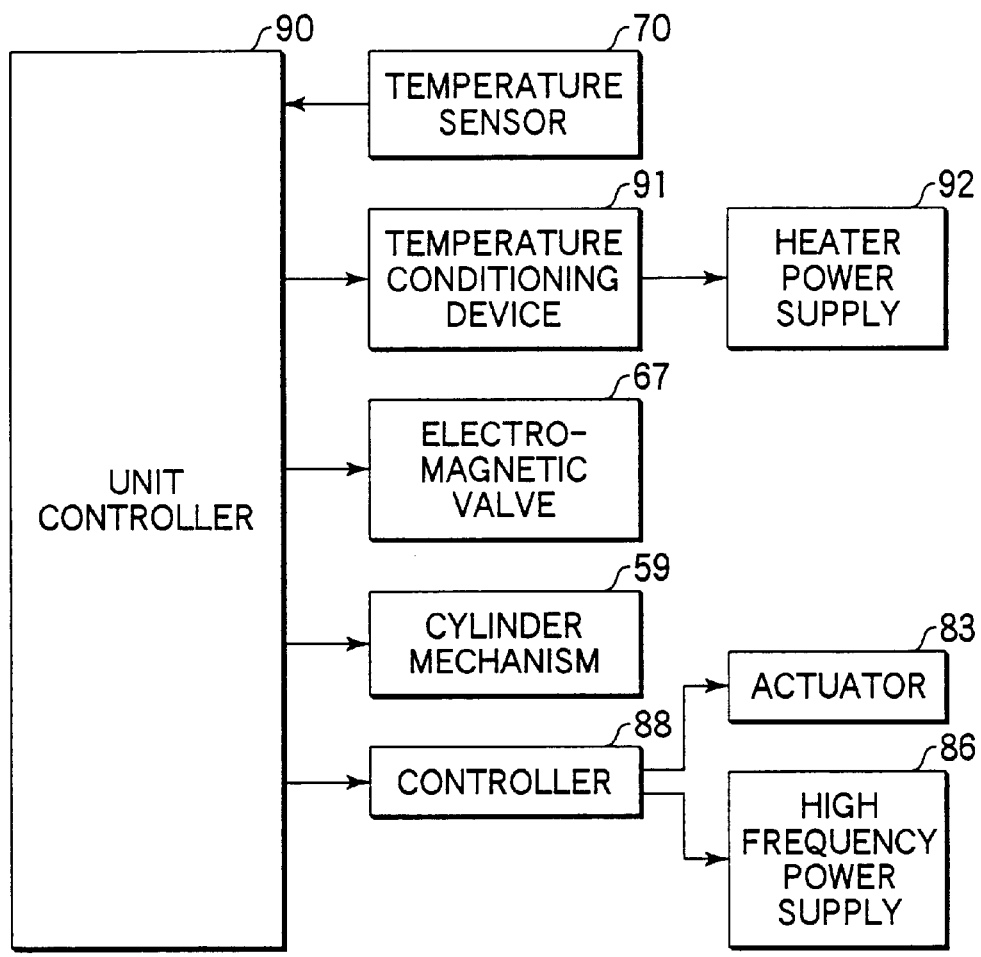
FIG. 7 is a block diagram of a control system of the heat processing apparatus as shown in FIG. 4.

As shown in FIG. 7, the heat processing apparatus HP of the present embodiment is controlled by a unit controller 90. Concretely, there are provided in suitable places of the hot plate 51 a plurality of temperature sensors 70 such as thermocouples for measuring temperatures of the hot plate 51. The signals from the temperature sensors 70 are transmitted to the unit controller 90 which transmits, on the basis of the sensor signals, a control signal to a temperature conditioning device 91 which further transmits, on the basis of the control signal, a output control signal to heater power supply 92. Further, the unit controller 90 executes a control of ascent or descent of pins 56 by transmitting a control signal to the cylinder mechanism 59, and executes an exhaust control by controlling the opening of the electromagnetic valve 67. Further, the unit controller 90 controls the first heat pipe 73 on the basis of the detection signal from the temperature sensors 70 or a prescribed value. Further, the unit controller 90 can also output control signals on the basis of a not-shown system controller of the coating and development system.

Next, the heat processing of the wafer W by the heat processing apparatus HP of the present embodiment is explained.

First, the wafer W is transported by the wafer transport apparatus 46 into the casing 50 of the heat processing apparatus HP, transported to the pins 56, and placed, by descending the pins 56, on the proximity pins 52 on the surface of the hot plate 51 which is heated at a prescribed temperature.

Then, The surrounding member 62 and the ceiling 63 is let down so as to form the process space S, and an air is introduced by exhausting the process space S by a not-shown exhaust mechanism through the exhaust port 65 and the exhaust pipe 66, thereby executing a heat processing to the wafer W in an air flow from the circumference of the hot plate 51 to the center of the ceiling 63.

As the air flows from the circumference of the wafer W to the center of the wafer W and the heated air passing over the high temperature wafer W concentrates at the center of the wafer W and finally exhausted out from the process space S, the temperature of the wafer center becomes higher than that of the wafer circumference, even when the hot plate 51 is heated uniformly by the heater 53.

Therefore, in the present embodiment, the temperature of the first region 71 on the ceiling 63 around the center of the wafer W is controlled by the temperature control mechanism 80 to become lower by a prescribe degree than that of the second region 72 around the circumference of the wafer W. The wafer temperature is affected not only by the hot plate 51, but also by the ceiling 63 opposite to the hot plate 51. Concretely, the wafer temperature lowers, as the heat absorption of ceiling 63 is greater and the heat radiation of the ceiling 63 is smaller. The heat absorption becomes greater and the heat emission from the wafer center becomes greater, if the temperature of the first region 71 is made lower than that of the second region 72 under the condition that the wafer center temperature tends to be higher than that of the wafer circumference. Therefore, the temperature at the central portion of the wafer W lowers, thereby improving a uniformity in temperature on the wafer surface. Further, as the temperature control mechanism 80 controls the temperature fall around the wafer center, the wafer temperature becomes quite uniform.

Here, a principle of obtaining a uniform temperature on the wafer W is explained simply.

In a system wherein the hot plate 51 is placed opposite to the ceiling 63, a part of the thermal radiation energy emitted from the wafer W heated by the hot plate 51 is absorbed and at the same time the remainder thereof is reflected by the ceiling 63. Further, a part of the reflected component is absorbed and at the same time the remainder thereof is reflected by the wafer W. Thus, the absorptions and reflections of thermal radiation energy are repeated. Here, a total energy $Q_1$ per unit area emitted from the wafer W is equal to the emission energy $E_1$ of the wafer W plus $r_1$ multiplied by $Q_2$, where $r_1$ is a reflectivity of the wafer W and $Q_2$ is a total energy emitted from the ceiling 63.

$$Q_1 = E_1 + r_1 Q_2 \tag{1}$$

Similarly, a total energy $Q_2$ per unit area emitted from the ceiling 63 is equal to the emission energy $E_2$ of the ceiling 63 plus $r_2$ multiplied by $Q_1$, where $r_2$ is a reflectivity of the ceiling 63 and $Q_1$ is a total energy emitted from the wafer W.

$$Q_2 = E_2 + r_2 Q_1 \tag{2}$$

Further, introducing an emissivity $\epsilon_1$ of the wafer W and an emissivity $\epsilon_2$ of the ceiling 63, $$r_1 = 1 - \epsilon_1 \tag{3}$$

$$r_2 = 1 - \epsilon_2 \tag{4}$$

Substituting formulae (3) and (4) into formulae (1) and (2), $$Q_1 = E_1 + (1 - \epsilon_1) Q_2 \tag{5}$$

$$Q_2 = E_2 + (1 - \epsilon_2) Q_1 \tag{6}$$

As the temperature $T_1$ of the wafer W is higher than the temperature $T_2$ of the ceiling, the heat energy Q due to the difference $(T_1-T_2)$ is supplied from the wafer W to the ceiling 63.

$$Q=Q_1-Q_2 \qquad (7)$$

The greater the Q, the greater the temperature fall of the wafer W. In other words, it suffices that the thermal energy Q emitted from the wafer center of which temperature tends to be high in the conventional heat processing apparatus. Accordingly, it suffices that the thermal absorption of the first region 71 is made high, by making the temperature of the first region 71 lower than that of the second region 72. Further, as the first and second regions 71 and 72 include the first and second heat pipes 73 and 74, respectively, the temperature in each region is made uniform, due to each heat pipe. Further, the temperature of the first heat pipe 73 is made rapidly to be a prescribed temperature by using the temperature control mechanism 80, due to the rapid heat transportation by the heat pipe. Thus, the temperature is made extremely uniform all over the wafer surface.

Further, it is effective that the heat absorption of the first region 71 is made higher than that of the second region 72. Consequently, a color of the first region 71 may be made different from that of the second region 72. Particularly, the first region 71 may be a black body of which emissivity is 1, while the second region may be a mirror of which reflectivity is 1.

Figure 8:
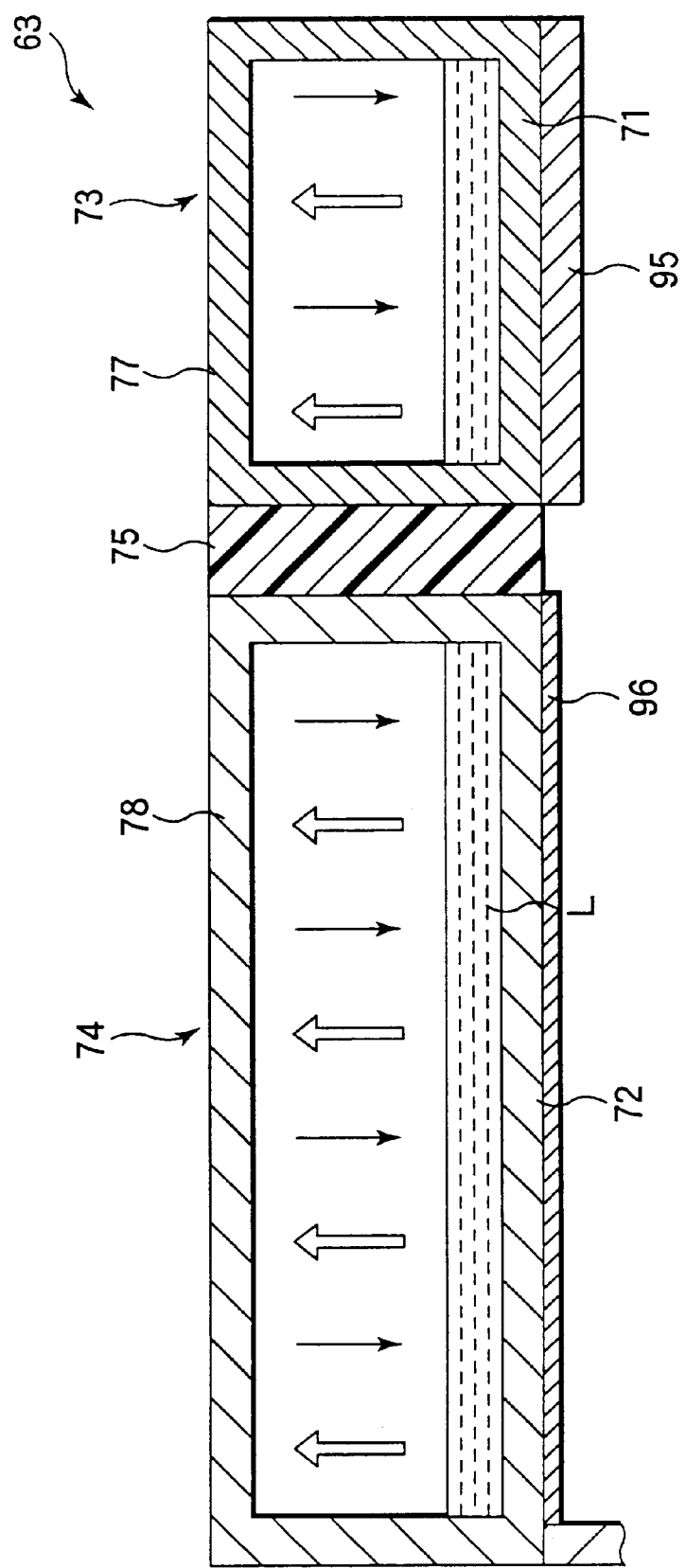
FIG. 8 is a cross sectional view of a variation of the first and second heat pipes as shown in FIG. 6.

As shown in FIG. 8, a black ceramics plate 95 may preferably be attached on the lower surface of the container 77 in order to make a black body of the first region 71, while a gold foil 96 may preferably be attached on the lower surface of the container 78 in order to make a mirror of the second region 72.

After completing the heat processing, the surrounding member 62 and the ceiling 63 are moved upward and the wafer W is moved upward by the pins 56. Then, the wafer transport apparatus 46 receives the wafer W, transports the wafer W out of the heat processing apparatus HP to a unit for the next step.

Figure 9:
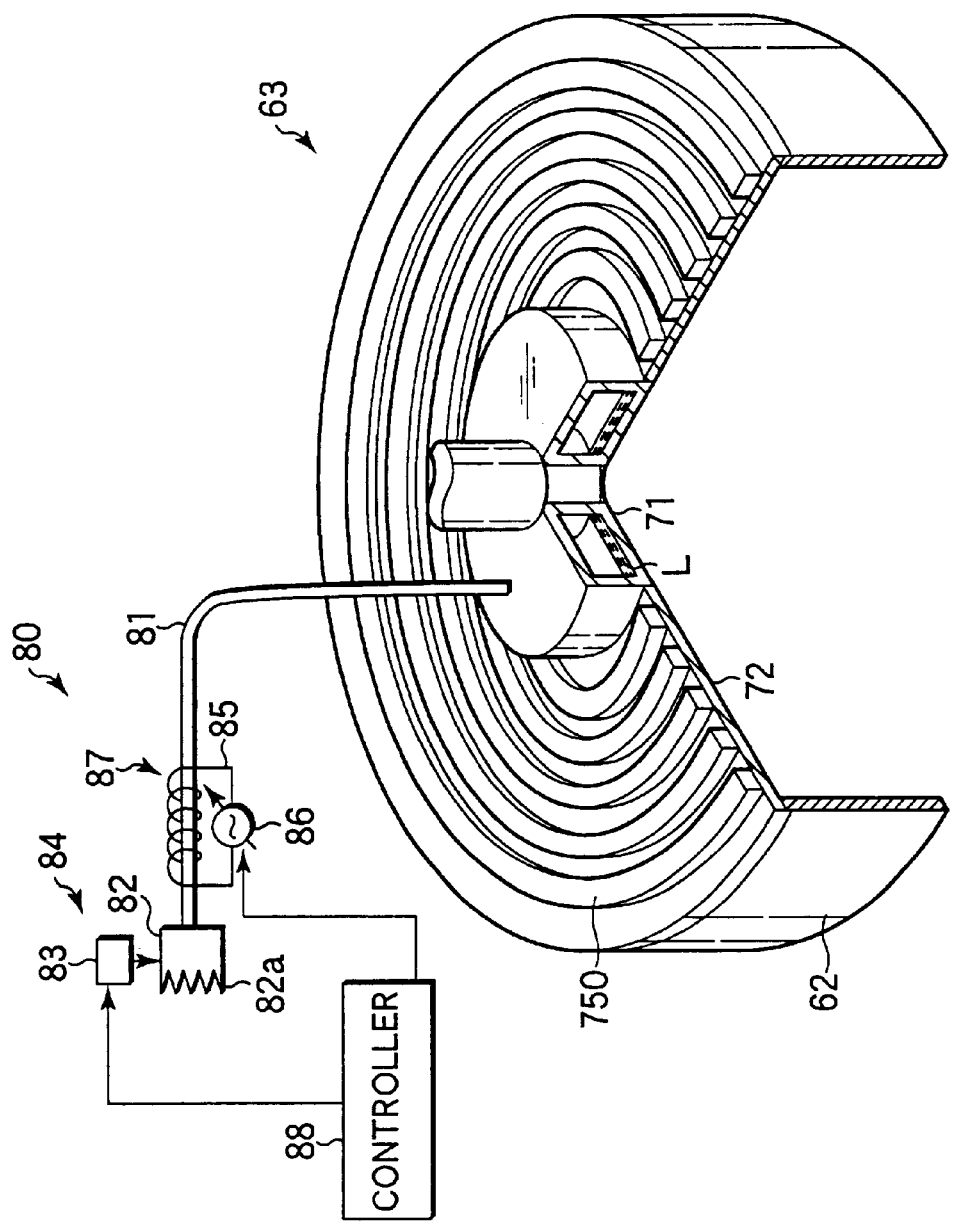
FIG. 9 is a partially cutaway view in perspective of another ceiling in the heat processing apparatus as shown in FIG. 4.

Further, another ceiling as shown in FIG. 9 may be used for the heat processing apparatus of the present embodiment.

As shown in FIG. 9, there are provided on the surface of the ceiling 63 opposite to the hot plate 51 a first annular region 71 including a heat pipe 73 surrounding the exhaust port 65 and a second annular region 72 of a metallic plate 740 including heaters 750 thereupon outside the first region 71. Further, there is provided between the first region 71 and the second region 72 an adiabatic member 73a for reducing a thermal interference. The heat pipe 73 may be separated from the metallic plate 740 without putting the adiabatic member 73a.

Figure 10:
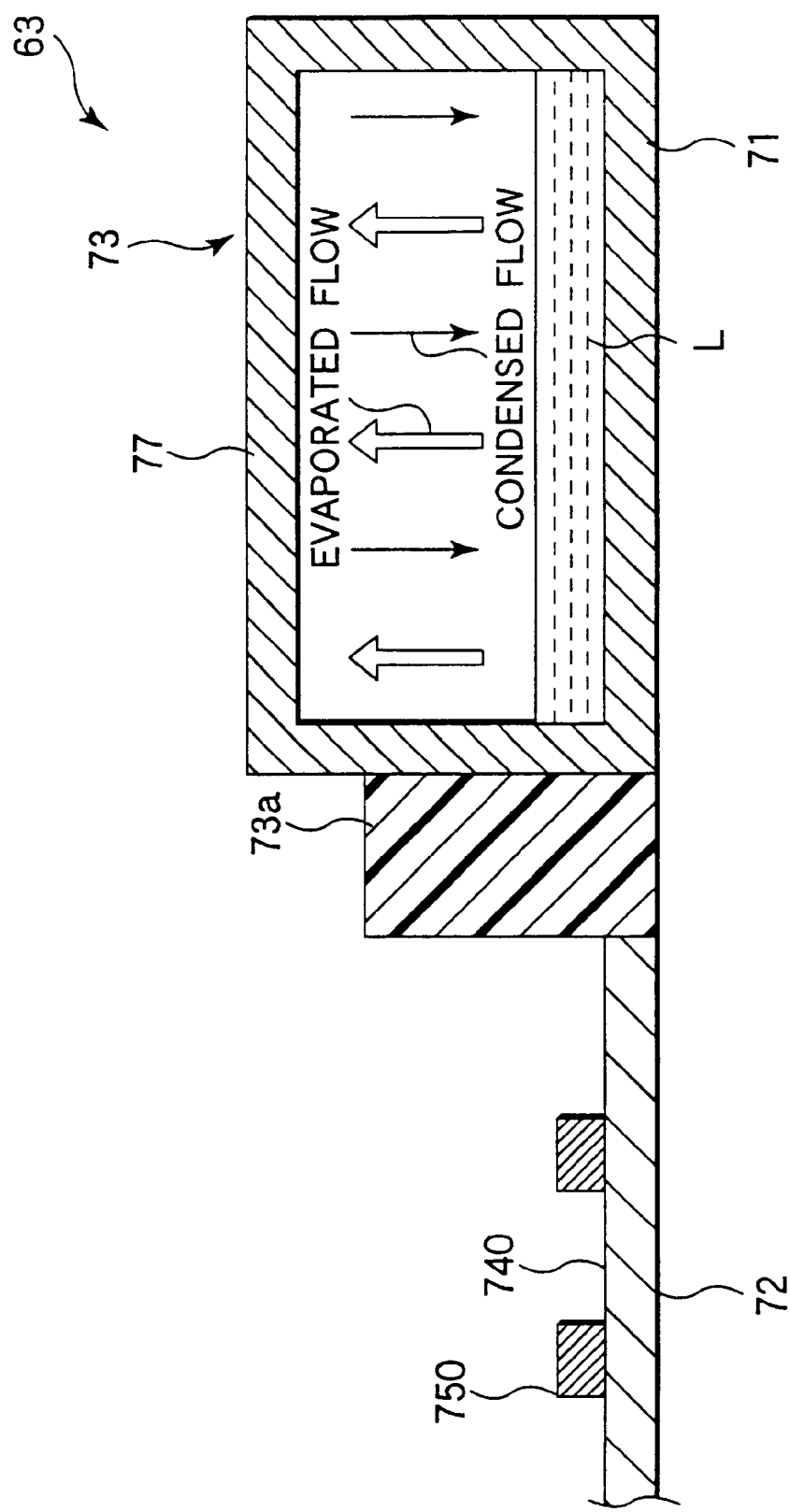
FIG. 10 is cross sectional view of the ceiling as shown in FIG. 9.

The heat pipes as shown in FIGS. 9 and 10 are similar to those as shown in FIGS. 5 and 6, and the temperature control mechanism 80 as shown in FIG. 9 is the same as that as shown in FIG. 5.

Figure 11:
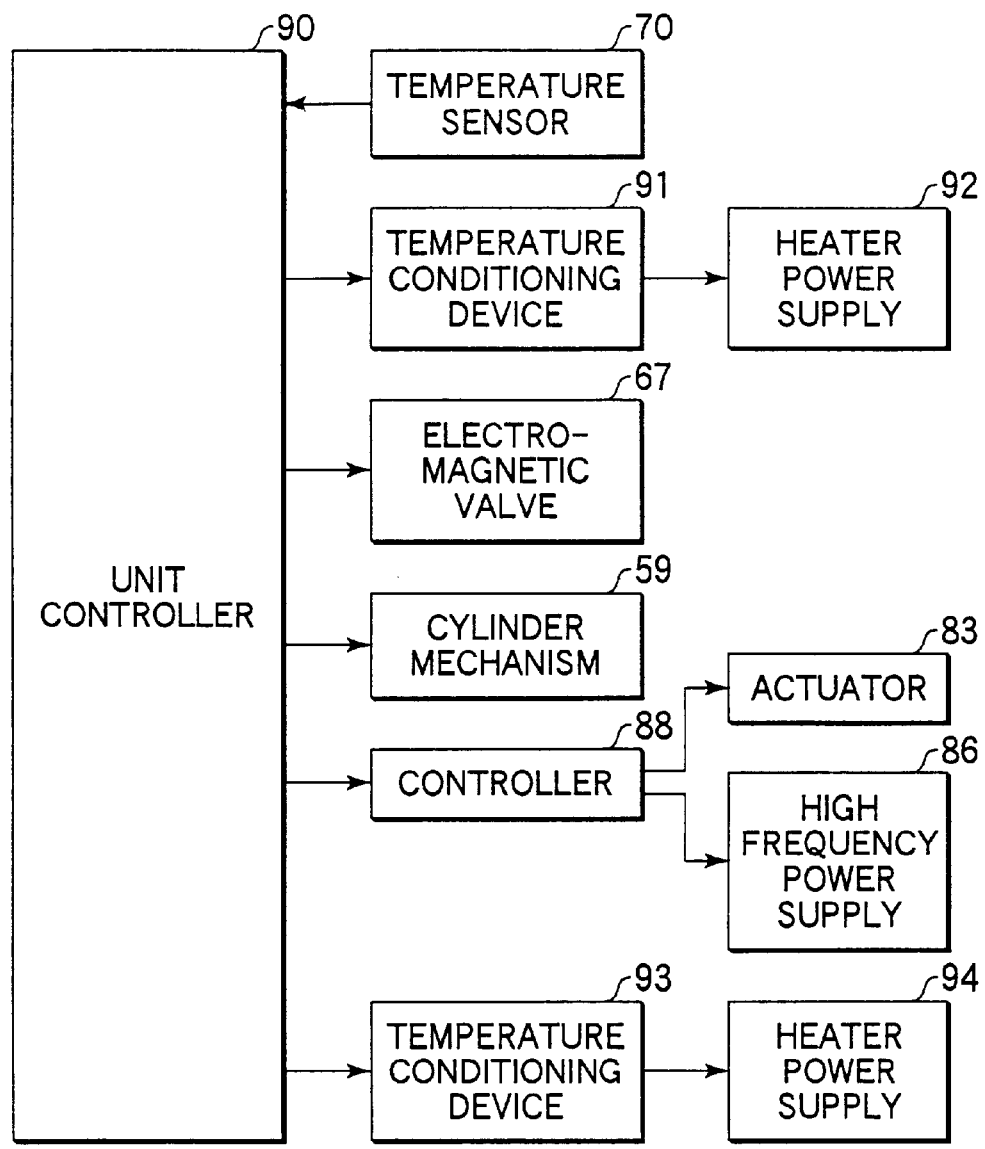
FIG. 11 is a block diagram of another control system of the heat processing apparatus as shown in FIG. 4.

As shown in FIG. 11, the heat processing apparatus HP of the present embodiment is controlled by a unit controller 90 with a temperature conditioning device 93 for controlling a heater power supply 94 for the heater 750 for heating the second region 72. The unit controller 90 outputs a control signal to the temperature conditioning devise 93 to control the heater power supply 94. The other features of the unit controller 90 are the same as that as shown in FIG. 7.

The temperature of the first region 71 is made lower than that of the second region 72, by heating the second region 72 by using the heater 750 as well as controlling the temperature of the first region 71 by the temperature control mechanism 80, thereby increasing the heat absorption by the first region 71. Moreover, the wafer temperature becomes quite uniform, because the heat emission from the second region 72 is suppressed due to the heating of the second region 72.

Figure 12:
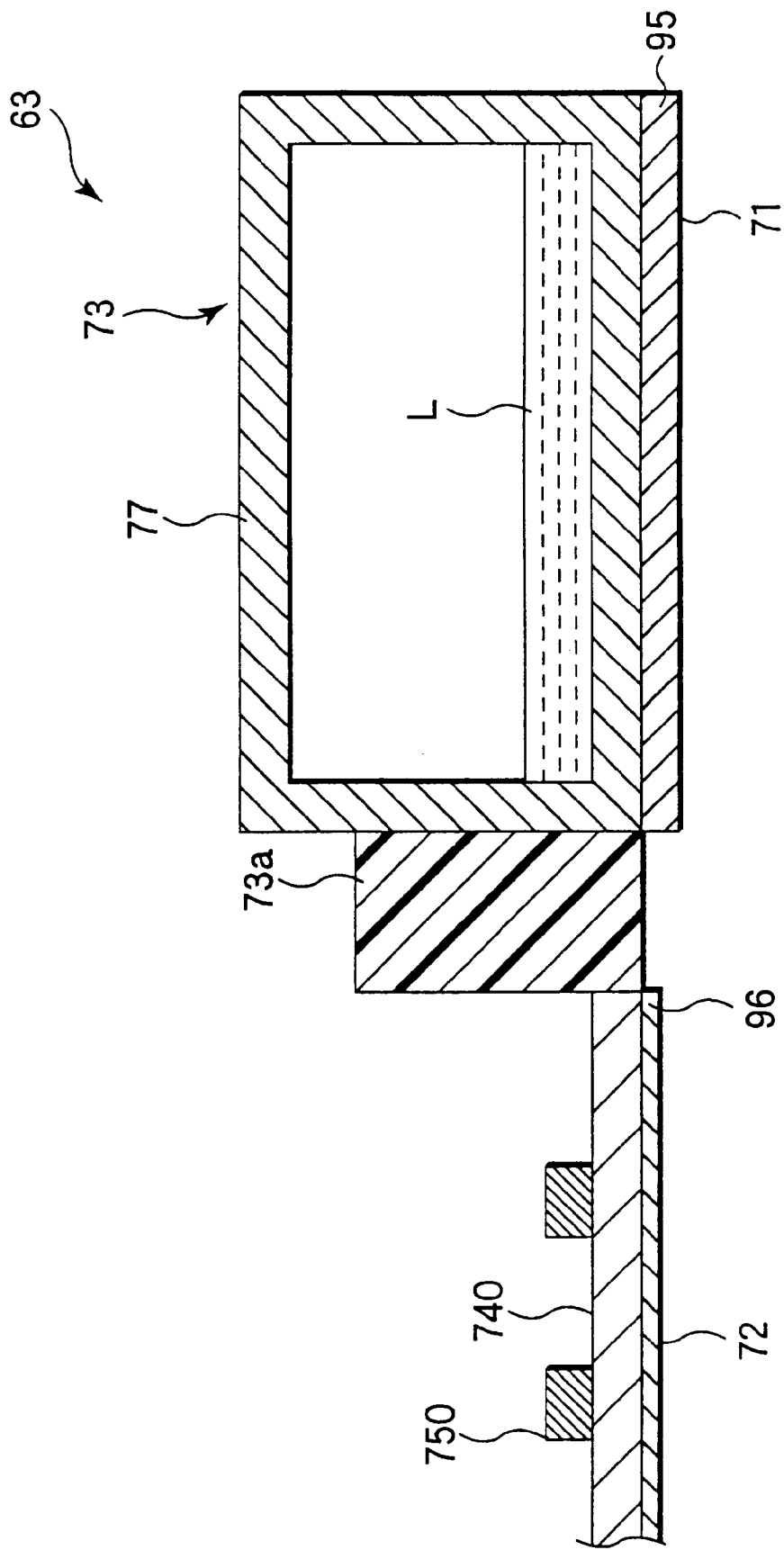
FIG. 12 is a cross sectional view of a variation of the heat pipe as shown in FIG. 10.

As shown in FIG. 12, it is also effective that a black ceramics plate 95 is attached on the lower surface of the container 77, while a gold foil 96 is attached on the lower surface of the metallic plate 740, thereby increasing the heat absorption by the first region.

Further, still another ceiling may be used for the heat processing apparatus of the present embodiment.

Figure 13:
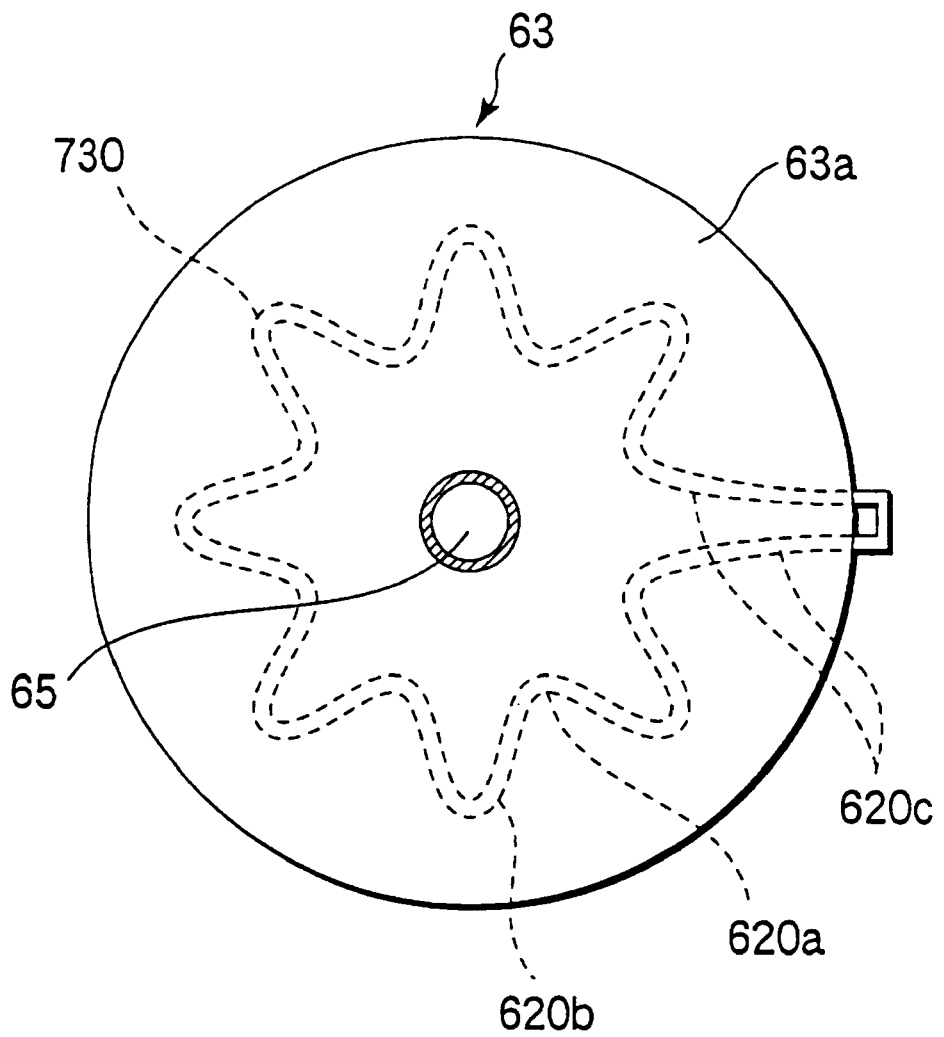
FIG. 13 is a plan view of still another ceiling in the heat processing apparatus as shown in FIG. 4.

As shown in FIGS. 13, a ceiling 63 includes a star shaped heat pipe 730 with an annular portion 620a with convex portions 620b in order to make the temperature on the surface 63a of the ceiling 63 uniform. The heat pipe 730 includes an extension portion 620c connected with a part of the star shaped portion 620a and extending the circumference of the ceiling 63.

The edge of the extension portion 620c may be kept in contact with a Peltier device, thereby cooling the ceiling 63. A fin is attached to the Peltier device, thereby emitting the heat of the Peltier device. Further, one or more temperature sensors may be provided on the ceiling 63a in order to switch on and off the Peltier device. Further, there is provided an exhaust port 65 at the center of the ceiling 63a. Further, there is coated on the lower surface of the ceiling 63a opposite to the wafer a fluororesin, thereby suppressing an adhesion of contaminations evaporated from the wafer W. The other surfaces of the ceiling 63 may be coated by the fluororesin.

According to the Peltier device, the temperature of the ceiling 63 follows rapidly the temperature of the hot plate 51, when the hot plate temperature is changed. Further, according to the star shaped portion, the heat pipe 730 is arranged uniformly on the surface of the ceiling 63, thereby keeping the temperature uniform on the surface of the ceiling 63 and on the surface of the wafer W.

Further, in place of the Peltier device, an air tube may be used. In this case, the extension portion 620c of the heat pipe 730 is introduced into the inside of the air tube, thereby exchanging heat between the air and the extension portion. When the temperature of the hot plate 51 is to be fallen down, a cool air is supplied into the air tube, thereby rapidly stabilizing the ceiling 63 and the hot plate 51 at a lower temperature. On the other hand, when the temperature of the hot plate 51 is to be raised, a hot air is supplied into the air tube, thereby rapidly stabilizing the ceiling 63 and the hot plate 51 at a higher temperature. Here, other fluid such as $N_2$ gas or water may be supplied into the air tube, in place of the air. Further, the air may be blown directly on the extension portion 620c of the heat pipe 730.

The present invention is not limited to the above explained first embodiment, wherein an air flow is generated in the process space S, by introducing an air through a minute gap.

Figure 14:
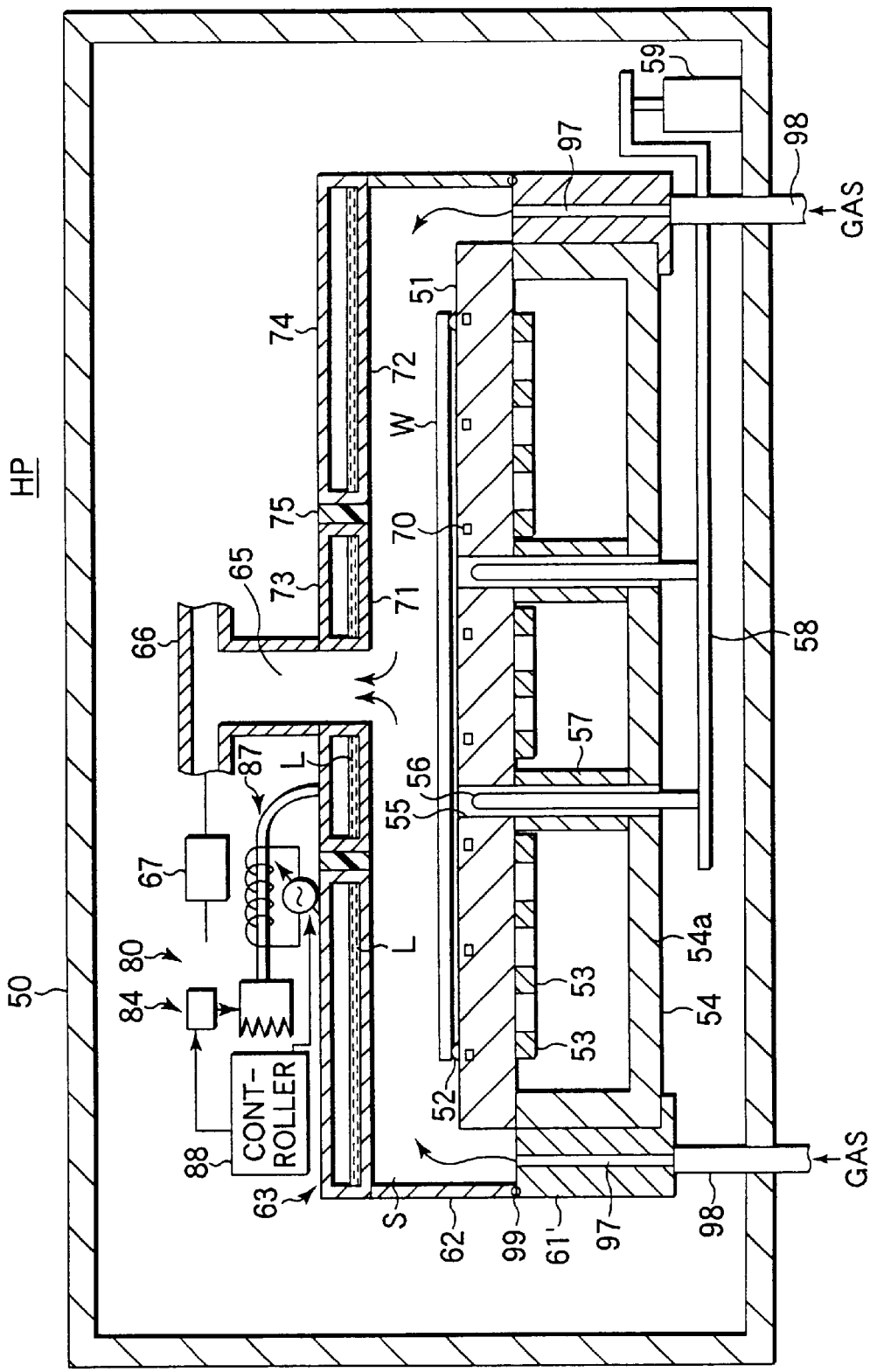
FIG. 14 is a cross sectional vies of a variation of the heat processing apparatus as shown in FIG. 4.

As shown in FIG. 14, such a gas as an inert gas may be introduced through a gas supply tube 98 into the process space S. In this case, a support ring 61' with a gas flow hole 97 is provided, in place of the support ring 61, and the gas supply tube 98 is connected with the gas flow tube 97. Further, the surrounding member 62 and the support ring 61' may be sealed by a seal ring 99. Further, one or more gas flow hole 97 is provided along the circumference of the support ring 61'.

(Second Embodiment)

In this embodiment, there is not provided an exhaust port at the center of the ceiling, but an air is introduced through a gas inlet holes and exhausted from a gas outlet holes in order to obtain a unidirectional air flow.

Figure 15:
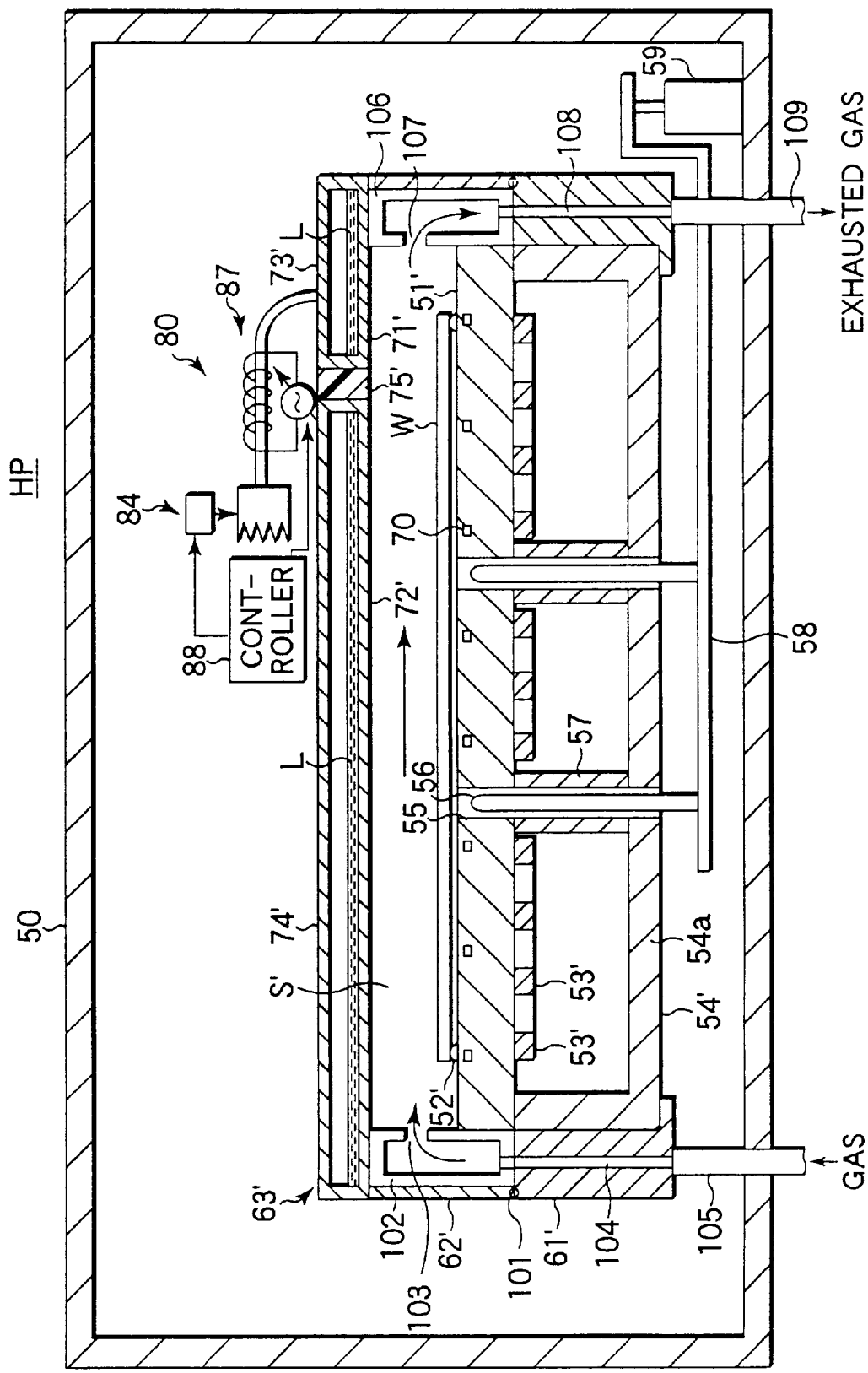
FIG. 15 is a cross sectional view of a heat processing apparatus of the second embodiment of the present invention.
Figure 16:
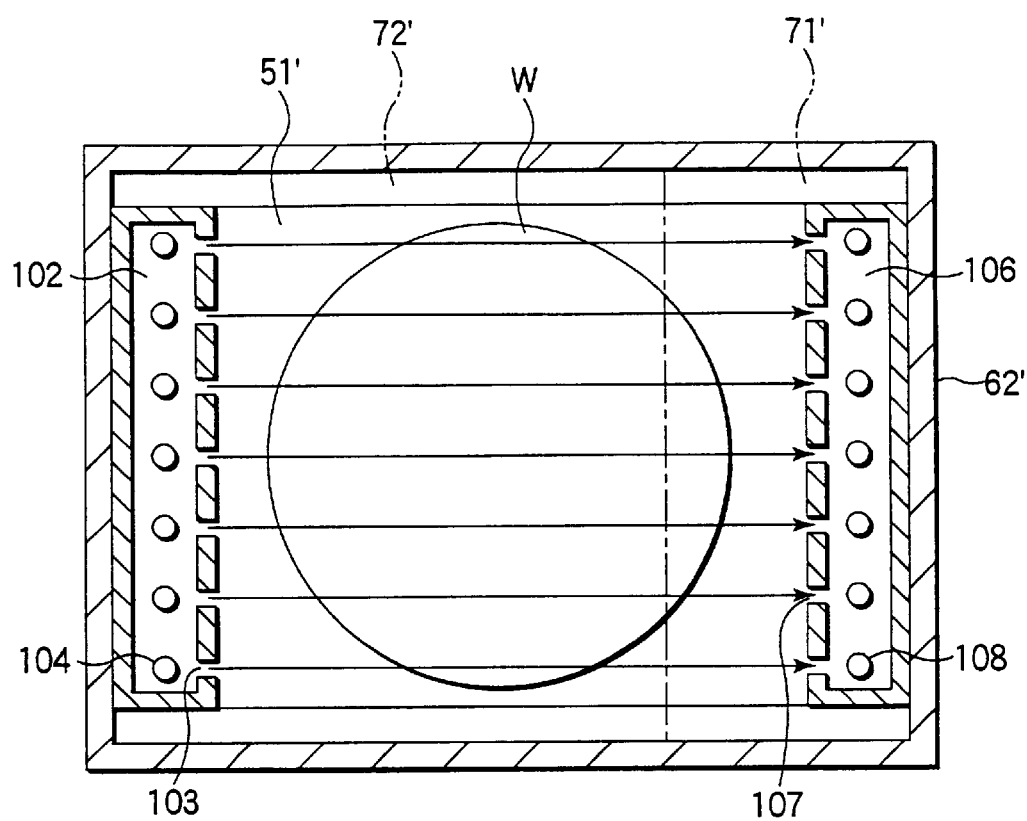
FIG. 16 is a plan view of an inside of the heat processing apparatus as shown in FIG. 15 for explaining an air flow.

The heat processing apparatus of the second embodiment is explained, referring to FIGS. 15 and 16, wherein the reference numerals are the same as those for the identical elements as shown in FIG. 4.

In this embodiment, a rectangular hot plate 51' is arranged in a casing 50. The surface of the hot plate 51' is provided with proximity pins 52' on which the wafer W is placed in the proximity of the hot plate surface. There are arranged under the back surface of the hot plate 51' a plurality of linear heaters 53' in a parallel manner. The heaters 53' is heated by electric currents, thereby heating the hot plate 51' and the wafer W.

The hot plate 51' is supported by a hollow support member 54'. Around the hollow support member 54' a support member 61' on which there is provided a surrounding member 62' on which there is further provided a ceiling 63', thereby forming a process space S' for processing of the Wafer W, surrounded by the surrounding member 62', between the ceiling 63' and the hot plate 51'. At one end of the hot plate 51', there is provided a gas supply nozzle 102 with a plurality of gas inlet holes 103 of which width is about the same as that of the hot plate 51'. The gas supply nozzle 102 is connected with a plurality of gas flow holes 104 provided in the support member 61'. Further, the gas flow holes 104 is connected with a gas supply tube 105 for supplying a gas such as an inert gas, or an air.

At the other end of the hot plate 51', there is provided a gas exhaust nozzle 106 with a plurality of gas outlet holes 107 of which width is about the same as that of the hot plate 51'. The gas exhaust nozzle 106 is connected with a plurality of gas flow holes 108 provided in the support member 61'. Further, the gas flow holes 108 is connected with a gas exhaust tube 109.

As the gas supplied from the gas supply nozzle 102 into the process space S' is exhausted from the gas exhaust nozzle 106, an unidirectional gas flow from one end of the hot plate 51' to the other end of the hot plate 51' is generated in the process space S'.

There are provided on the surface of the ceiling 63' opposite to the hot plate 51' a first rectangular region 71' at one end of the hot plate 51' including a first heat pipe 73' and a second rectangular region 72' including a second heat pipe 74' at the other end of the hot plate 51'. Further, there is provide between the first heat pipe 73' and the second heat pipe 74' an adiabatic member 75' which reduces a thermal interference between the first heat pipe 73' and the second heat pipe 74'. The first heat pipe 73' may be separated from the second heat pipe 74' without putting the adiabatic member 75'.

The first and second rectangular heat pipes 73' and 74' are similar to the heat pipes as shown in FIG. 5, except their shapes.

Further, a temperature control mechanism 80 as shown in FIG. 4 is attached to the first heat pipe 73'. The temperature control mechanism 80 works in such a manner that the temperature of the first region 71' is lower by a prescribed degree than that of the second region 72'.

Next, the heat processing of the wafer W by the heat processing apparatus HP of the present embodiment is explained.

First, the wafer W is transported by the wafer transport apparatus 46 into the casing 50 of the heat processing apparatus HP, transported to the pins 56, and placed, by descending the pins 56, on the proximity pins 52' on the surface of the hot plate 51'.

Then, the surrounding member 62' and the ceiling 63' is let down so as to form the process space S', and a gas is introduced through the gas supply tube 105 and the gas flow holes 104 and exhausted through the gas flow holes 108 and the gas exhaust tube 109, thereby forming a unidirectional gas flow from one end to the other end of the hot plate 51'.

In the above-mentioned gas flow, the wafer W on the hot plate 51' is heated by supplying the heater 53' with an electric power. In this embodiment, particles and dusts do not fall down from a stagnated gas flow, because there is not a exhaust port in the ceiling 63' and the gas flows in one direction. Further, according to the present embodiment, the height of the heat processing apparatus becomes low, because the exhaust mechanism is not attached to the ceiling 63'.

As the heated gas passes over the high temperature wafer W in the unidirectional gas flow, the temperature of the wafer W tends to become higher at the exhaust nozzle 106, even when the hot plate 51' is heated uniformly by the heater 53'.

Therefore, in the present embodiment, the temperature of the first region 71' is controlled by the temperature control mechanism 80 so as to become lower by a prescribe degree than that of the second region 72', thereby increasing the heat absorption by the first region 71'. Consequently, the heat emission from the wafer W near the exhaust nozzle 106 becomes greater, and the temperature of the wafer W near the exhaust nozzle 106 lowers, thereby improving a uniformity in temperature on the wafer surface. Further, due to the rapid heat conduction of the heat pipes, the wafer temperature becomes quite uniform and stabilizes rapidly.

Further, it is effective that the color of the first region 71' may be made different from that of the second region 72'. Particularly, the first region 71' may be a black body, while the second region 72' may be a mirror.

The present invention is not limited to the above-explained first and second embodiment. For example, the lower surface of the ceiling opposite to the hot plate may be divided into three regions. Further, the heat control system may control the temperature of the second region, or of both the first and second regions. Further, the heat pipe may be substituted by some other device. Further, the structure of the heat processing apparatus may be varied. Further, the heat processing apparatus may be used for other processing in addition to the resist coating and development. Further, the wafer may be placed directly on the hot plate surface. Further, other substrate such as a glass substrate for a liquid crystal display (LCD) apparatus may be used in addition to a semiconductor wafer.

What is claimed is:

1. A heat processing apparatus for heating a substrate up to a prescribed temperature, which comprises:
   a hot plate for putting said substrate on or near its surface;
   a ceiling with first and second regions opposite to the hot plate surface; and
   a temperature control mechanism for controlling a regional temperature of at least one of said first and second regions,
   wherein said temperature control mechanism controls said regional temperature, in accordance with a temperature distribution of said substrate heated by said hot plate.

2. The heat processing apparatus according to claim 1, wherein:
   said first and second regions includes first and second heat pipes, respectively;
   said temperature control mechanism controls a temperature of at least one of said first and second heat pipes, in accordance with a temperature distribution of said substrate heated by said hot plate.

3. The heat processing apparatus according to claim 2, wherein said temperature control mechanism comprises:
   a heat emission mechanism for emitting a heat from one of said heat pipes which is opposite to a part of said substrate whose temperature is higher than the temperature of the rest of said substrate;
   a heat injection mechanism for injecting a heat into said one of said heat pipes; and
   a controller for controlling at least one of said heat emission mechanism and said heat injection mechanism.

4. The heat processing apparatus according to claim 1, wherein:
   said first region is opposite to a portion of said substrate whose temperature is higher than the temperature of the rest of said substrate; and
   said temperature control mechanism controls said regional temperature in such a manner that the temperature of said first region is lower than that of said second region.

5. The heat processing apparatus according to claim 4, wherein said temperature control mechanism controls only the regional temperature of said first region.

6. The heat processing apparatus according to claim 4, wherein a thermal absorption rate of said first region is greater than that of said second region.

7. The heat processing apparatus according to claim 6, wherein a black body is attached to said first region, while a mirror is attached to said second region.

8. The heat processing apparatus according claim 1, which further comprises gas flow generation means for generating a gas flow in a space between said hot plate and said ceiling.

9. A heat processing apparatus for heating a substrate up to a prescribed temperature, which comprises:
   a hot plate for putting said substrate on or near its surface;
   a ceiling with first and second concentric regions opposite to the hot plate surface;
   a surrounding member for surrounding a space between said hot plate and said ceiling;
   gas flow generation means for generating a gas flow in said space from a circumference of said hot plate to a center of said ceiling, and
   a temperature control mechanism for controlling a regional temperature of said first region,
   wherein said temperature control mechanism controls said regional temperature in such a manner that a heat emission is greater from a center of said substrate than from a circumference of said substrate.

10. The heat processing apparatus according to claim 9, wherein said first region includes a first heat pipe, and said second region includes a second heat pipe.

11. The heat processing apparatus according to claim 10, wherein said temperature control mechanism comprises:
   a heat emission mechanism for emitting a heat from said first heat pipe;
   a heat injection mechanism for injecting a heat into said first heat pipe; and
   a controller for controlling at least one of said heat emission mechanism and said heat injection mechanism.

12. The heat processing apparatus according to claim 9, wherein a thermal absorption rate of said first region is greater than that of said second region.

13. The heat processing apparatus according to claim 12, wherein a black body is attached to said first region, while a mirror is attached to said second region.

14. The heat processing apparatus according to claim 9, wherein:
   a exhaust port is provided at a center of said ceiling;
   said first region surrounds said exhaust port; and
   said gas flow generation means includes an exhaust mechanism for exhausting from
   said exhaust port a gas introduced from said circumference of said hot plate.

15. The heat processing apparatus according to claim 14, wherein said gas flow generation means further comprises a gas supply mechanism for supplying said gas from said circumference of said hot plate.

16. The heat processing apparatus according to claim 2, wherein said first heat pipe is adjacent to said second heat pipe, with an adiabatic member between them.

17. The heat processing apparatus according to claim 9, wherein said first heat pipe is adjacent to said second heat pipe, with an adiabatic member between them.

18. A heat processing apparatus for heating a substrate up to a prescribed temperature, which comprises:
   a hot plate for putting said substrate on or near its surface;
   a ceiling with first and second concentric regions opposite to the hot plate surface;
   a temperature control mechanism for controlling a regional temperature of said first region; and
   a heating mechanism for heating said second region,
   wherein said first region is opposite to a part of said substrate whose temperature is higher than the temperature of the rest of said substrate, while said second region is opposite to the rest of said substrate;
   said temperature control mechanism controls said regional temperature in such a manner that said regional temperature is lower in said first region than in said second region; and
   said heating mechanism heats said second region up to a prescribed temperature in accordance with a temperature at a part of said substrate opposite to said second region.

19. The heat processing apparatus according to claim 18, wherein said first region includes a first heat pipe.

20. The heat processing apparatus according claim 18, which further comprises gas flow generation means for generating a gas flow in a space between said hot plate and said ceiling.

21. A heat processing apparatus for heating a substrate up to a prescribed temperature, which comprises:
   a hot plate for putting said substrate on or near its surface;
   a ceiling with first and second concentric regions opposite to the hot plate surface;
   a surrounding member for surrounding a space between said hot plate and said ceiling;
   gas flow generation means for generating a gas flow in said space from a circumference of said hot plate to a center of said ceiling;
   a temperature control mechanism for controlling a regional temperature of said first region; and
   a heating mechanism for heating said second region,
   wherein: said temperature control mechanism controls said regional temperature in such a manner that said regional temperature is lower in said first region than in said second region; and said heating mechanism heats said second region in accordance with a temperature of a part of said substrate opposite to said second region.

22. The heat processing apparatus according to claim 21, wherein:

said first region includes a first heat pipe; and said temperature control mechanism controls a temperature of said first region by controlling a temperature of said first heat pipe.

23. The heat processing apparatus according to claim 22, wherein:

a exhaust port is provided at a center of said ceiling;

said first region surrounds said exhaust port; and said gas flow generation means includes an exhaust mechanism for exhausting from said exhaust port a gas introduced from said circumference of said hot plate.

24. The heat processing apparatus according to claim 23, wherein said gas flow generation means further comprises a gas supply mechanism for supplying said gas from said circumference of said hot plate.

25. The heat processing apparatus according to claim 19, wherein said temperature control mechanism comprises:

a heat emission mechanism for emitting a heat from said first heat pipe;

a heat injection mechanism for injecting a heat into said first heat pipe; and a controller for controlling at least one of said heat emission mechanism and said heat injection mechanism.

26. The heat processing apparatus according to claim 22, wherein said temperature control mechanism comprises:

a heat emission mechanism for emitting a heat from said first heat pipe;

a heat injection mechanism for injecting a heat into said first heat pipe; and a controller for controlling at least one of said heat emission mechanism and said heat injection mechanism.

27. The heat processing apparatus according to claim 18, wherein said heating mechanism heats said second region up to a temperature of a part of said substrate opposite to said second region.

28. The heat processing apparatus according to claim 18, wherein a thermal absorption rate of said first region is greater than that of said second region.

29. The heat processing apparatus according to claim 21, wherein a thermal absorption rate of said first region is greater than that of said second region.

30. The heat processing apparatus according to claim 28, wherein a black body is attached to said first region, while a mirror is attached to said second region.

31. The heat processing apparatus according to claim 29, wherein a black body is attached to said first region, while a mirror is attached to said second region.

32. The heat processing apparatus according to claim 18, wherein said second region includes another heat pipe.

33. The heat processing apparatus according to claim 21, wherein said second region includes another heat pipe.

* * * * *